(12) United States Patent
Wang et al.

(10) Patent No.: US 7,667,324 B2
(45) Date of Patent: Feb. 23, 2010

(54) SYSTEMS, DEVICES, COMPONENTS AND METHODS FOR HERMETICALLY SEALING ELECTRONIC MODULES AND PACKAGES

(75) Inventors: Tak K. Wang, Saratoga, CA (US); Christopher L. Coleman, Santa Clara, CA (US); Laurence R. McColloch, Santa Clara, CA (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 424 days.

(21) Appl. No.: 11/590,639

(22) Filed: Oct. 31, 2006

(65) Prior Publication Data
US 2008/0099908 A1    May 1, 2008

(51) Int. Cl.
*H01L 23/48* (2006.01)
(52) U.S. Cl. ............... 257/738; 257/781; 257/E23.015
(58) Field of Classification Search .......... 257/704, 257/710, 81, 98–100, E23.001, 738, 780, 257/781, E23.015
See application file for complete search history.

(56) References Cited

U.S. PATENT DOCUMENTS

| | | |
|---|---|---|
| 6,194,789 B1 | 2/2001 | Zhou |
| 6,218,730 B1 | 4/2001 | Toy et al. |
| 6,294,408 B1 | 9/2001 | Edwards et al. |
| 6,429,511 B2 | 8/2002 | Ruby et al. |
| 6,613,498 B1 | 9/2003 | Brown et al. |
| 6,784,535 B1 | 8/2004 | Chiu |
| 6,849,941 B1 | 2/2005 | Hill et al. |
| 6,860,652 B2 | 3/2005 | Narayan et al. |
| 6,867,368 B2 | 3/2005 | Kumar et al. |
| 6,900,509 B2 | 5/2005 | Gallup et al. |
| 6,905,618 B2 | 6/2005 | Matthew et al. |
| 6,919,222 B2 | 7/2005 | Geefay |
| 6,932,522 B2 | 8/2005 | Zhou |
| 6,936,919 B2 | 8/2005 | Chuang et al. |
| 6,947,224 B2 | 9/2005 | Wang |
| 6,996,304 B2 | 2/2006 | Aronson et al. |
| 6,998,691 B2 | 2/2006 | Baugh et al. |
| 7,066,660 B2 | 6/2006 | Ellison |
| 7,091,601 B2 | 8/2006 | Philliber |
| 7,176,436 B2 * | 2/2007 | Zheng et al. ............ 250/214 R |
| 2003/0116825 A1 | 6/2003 | Geefay |
| 2003/0197254 A1 | 10/2003 | Huang |
| 2003/0223709 A1 | 12/2003 | Lake et al. |
| 2004/0086011 A1 | 5/2004 | Bhandarkar |

OTHER PUBLICATIONS

ATV "Perfect Reflow Soldering" Sales Brochure (Date unkown).

* cited by examiner

*Primary Examiner*—Davienne Monbleau
*Assistant Examiner*—Hao B Trinh

(57) ABSTRACT

Disclosed are various embodiments of systems, devices and methods for forming an hermetic seal between a lid and a submount for an electronics module or package. At least one thieving pad is connected to a metallized ring formed about or near the circumference of an upper surface of the submount. A corresponding metallized ring is disposed about the lower perimeter of the lid. Solder paste is placed between the two metallized rings and melted, preferably under a reducing atmosphere. Excess molten solder controllably flows towards the at least one thieving pattern while the lid is being hermetically sealed and soldered, avoiding the formation of undesired wayward solder balls inside the package.

26 Claims, 7 Drawing Sheets

SYSTEMS, DEVICES, COMPONENTS AND METHODS FOR HERMETICALLY SEALING ELECTRONIC MODULES AND PACKAGES

FIELD OF THE INVENTION

The present invention relates to the field of electronics packaging and modules, and more particularly to the field of hermetically sealing same.

BACKGROUND

Optical transceiver modules or packages employed in telecommunications, fiber optic and server applications typically contain active electronic devices such as semiconductor lasers that must be hermetically sealed within the package to protect them from variations in humidity, dust and other ambient conditions.

Traditionally, glass frit seals and seam welds have been used to create hermetic seals in ceramic packages. Recently, much attention has been directed to replacing ceramic packages with Transistor Outline Metal-Can packages (or "TO can packages"). In a TO can package, hermetic sealing is achieved by projection welding. TO can packages capable of operating in excess of 10 Gbps are quite expensive, however. In contrast, micro-mechanical system (MEMS) packages made using batch processing techniques are capable of providing data rates in excess of 40 Gbps at much lower cost. Like TO can packages, ceramic packages are relatively expensive, and certainly more expensive than most MEMS packages formed of semiconductor material.

In a MEMS package, active components such as lasers and detectors are preferably mounted on a silicon submount. Passive components such as resistors and capacitors may be integrated onto the submount, or surface mounted on the submount. After assembly of such components on or in the submount has been completed, a lid is placed atop the submount and hermetically sealed thereto. Hermetic sealing of the lid to the submount must occur, however, under ambient conditions that will not damage or destroy the active and passive components mounted on or in the submount.

High frequency electrical signals must also be routed between the inside and outside of the package, and therefore the submount is usually not flat. Consequently, the sealing material employed to form the hermetic seal between the submount and the lid must have a relatively low viscosity to accommodate seal height variations. Finally, a high degree of precision is required to align the lid with the submount before and during sealing.

Frit glass and solder are materials often used to provide the aforementioned hermetic seals. Organic materials such as epoxy may also be employed to provide "near-hermetic" seals. In most cases, the sealing material is deposited onto the submount or the package before sealing occurs. A soldering preform material may also be inserted between the submount and package.

In general, a minimum thickness of sealing material is required to form a joint of sufficient reliability between the lid and submount. A joint that is too thin may have insufficient reliability and strength. A joint that is too thick may result in excessive squeeze-out of sealing material, more about which we say below.

A conventional process for hermetically sealing a lid to a submount involves pressing the lid onto the submount while the sealing material disposed therebetween is in a flowable state. When using frit glass or solder as the sealing material, the ambient temperature is raised until the glass or solder becomes at least partially flowable or malleable, at which point the lid and submount may be joined together.

While pressing or placing the lid atop the submount and onto the malleable or flowable sealing material, some sealing material may be expected to squeeze out of the joint area. The location and shape of the material squeezed out of the joint is very difficult, if not virtually impossible, to control. This problem is especially acute when solder is employed as the sealing material, and often results in random rogue balls of solder forming inside or outside the package. Squeezed-out sealing material such as balls of solder may cause problems in a package, by reducing joint reliability, reducing joint strength, shorting out or damaging circuits or components inside the package, and/or diminishing RF performance if the squeezed-out material is near an RF component.

What is needed is a method and corresponding device for controlling the squeeze-out of sealing material in hermetically sealed electronic modules or packages.

Various patents containing subject matter relating directly or indirectly to the field of the present invention include, but are not limited to, the following:

U.S. Pat. No. 6,194,789 to Zhou for "Flexible hermetic sealing," Feb. 27, 2000.

U.S. Pat. No. 6,218,730 to Toy et al. for "Apparatus for controlling thermal interface gap distance," Apr. 17, 2001.

U.S. Pat. No. 6,294,408 to Edwards et al. for "Method for controlling thermal interface gap distance," Sep. 25, 2001.

U.S. Pat. No. 6,429,511 to Ruby et al. for "Microcap wafer-level package," Aug. 6, 2002.

U.S. Pat. No. 6,613,498 to Brown et al. for "Modulated exposure mask and method of using a modulated exposure mask," Sep. 2, 2003.

U.S. Pat. No. 6,784,535 to Chiu for "Composite lid for land grid array (LGA) flip-chip package assembly," Aug. 31, 2004.

U.S. Pat. No. 6,849,941 to Hill et al. for "Heat sink and heat spreader assembly," Feb. 1, 2005.

U.S. Pat. No. 6,860,652 to Narayan et al. for "Package for housing an optoelectronic assembly," Mar. 1, 2005.

U.S. Pat. No. 6,867,368 to Kumar et al. for "Multi-layer ceramic feedthrough structure in a transmitter optical subassembly," Mar. 15, 2005.

U.S. Pat. No. 6,900,509 to Gallup et al. for "Optical receiver package," May 31, 2005.

U.S. Pat. No. 6,905,618 to Matthew et al. for "Diffractive optical elements and methods of making the same," Jun. 14, 2005.

U.S. Pat. No. 6,919,222 to Geefay for "Method for sealing a semiconductor device and apparatus embodying the method," Jul. 19, 2005.

U.S. Pat. No. 6,932,522 to Zhou for "Method and apparatus for hermetically sealing photonic devices," Aug. 23, 2005.

U.S. Pat. No. 6,936,919 to Chuang et al. for "Heatsink-substrate-spacer structure for an integrated-circuit package," Aug. 30, 2005.

U.S. Pat. No. 6,947,224 to Wang for "Methods to make diffractive optical elements," Sep. 20, 2005.

U.S. Pat. No. 6,996,304 to Aronson et al. for "Small form factor transceiver with externally modulated laser," Feb. 7, 2006.

U.S. Pat. No. 6,998,691 to Baugh et al. for "Optoelectronic device packaging with hermetically sealed cavity and integrated optical element," Feb. 14, 2006.

U.S. Pat. No. 7,066,660 to Ellison for "Optoelectronic packaging assembly," Jun. 27, 2006.

U.S. Pat. No. 7,091,601 to Philliber for "Method of fabricating an apparatus including a sealed cavity," Aug. 15, 2006.

U.S. Patent Publication No. 20030116825 to Geefay for "Wafer-level package with silicon gasket," Jun. 26, 2003.

U.S. Patent Publication No. 20030197254 to Huang for "Package for enclosing a laser diode module,"Oct. 23, 2003.

U.S. Patent Publication No. 20030223709 to Lake at al. for "Methods of sealing electronic, optical and electro-optical packages and related package and substrate designs," Dec. 4, 2003.

U.S. Patent Publication No. 20040086011 to Bhandarkar for "Planar and wafer level packaging of semiconductor lasers and photo detectors for transmitter optical sub-assemblies," May 6, 2004.

The dates of the foregoing publications may correspond to any one of priority dates, filing dates, publication dates and issue dates. Listing of the above patents and patent applications in this background section is not, and shall not be construed as, an admission by the applicants or their counsel that one or more publications from the above list constitutes prior art in respect of the applicant's various inventions. All printed publications and patents referenced herein are hereby incorporated by referenced herein, each in its respective entirety.

Upon having read and understood the Summary, Detailed Descriptions and Claims set forth below, those skilled in the art will appreciate that at least some of the systems, devices, components and methods disclosed in the printed publications listed herein may be modified advantageously in accordance with the teachings of the various embodiments of the present invention.

SUMMARY

Disclosed herein are various embodiments of systems, devices, components and methods for hermetically sealing electronic modules and packages.

In one embodiment of the present invention, there is provided an electronics module or package comprising a submount having an upper surface upon which a first metallized pattern is disposed, and a lid comprising a bottom edge, sidewalls and a top, the sidewalls and top forming a cavity for covering the electronics components, the bottom edge having a second metallized pattern disposed thereon or thereabout. The first and second metallized patterns are configured to form an hermetic seal when solder is disposed therebetween, and at least one thieving pad is operatively connected to the first metallized pattern. Electronics components may be disposed on, in or near the upper surface of the submount.

In another embodiment of the present invention, there is provided a method of hermetically sealing an electronics module or package comprising providing a submount having an upper surface upon which a first metallized pattern is disposed; providing a lid comprising a bottom edge, sidewalls and a top, the sidewalls and top forming a cavity, the bottom edge having a second metallized pattern disposed thereon or thereabout; providing at least one thieving pad connected to the first metallized pattern; and forming an hermetic seal between the first and second metallized patterns with solder.

In still another embodiment of the present invention, there is provided a method of hermetically sealing an electronics module or package comprising providing a semiconductor substrate/submount having an upper surface upon which a first metallized pattern is disposed; providing a lid comprising a bottom edge, sidewalls and a top, the sidewalls and top forming a cavity, the bottom edge having a second metallized pattern disposed thereon or thereabout; providing at least one standoff between, or incorporated into at least one of, the first and second metallized patterns; and forming an hermetic seal between the first and second metallized patterns with solder.

In addition to the foregoing embodiments of the present invention, review of the detailed description and accompanying drawings will show that other embodiments of the present invention exist. Accordingly, many combinations, permutations, variations and modifications of the foregoing embodiments of the present invention not set forth explicitly herein will nevertheless fall within the scope of the present invention.

BRIEF DESCRIPTION OF THE DRAWINGS

Different aspects of the various embodiments of the present invention will become apparent from the following specification, drawings and claims in which:

The drawings are not necessarily to scale. Like numbers refer to like parts or steps throughout the drawings.

DETAILED DESCRIPTIONS OF SOME PREFERRED EMBODIMENTS

Set forth below are detailed descriptions of some preferred embodiments of the systems, devices and methods of the present invention. Disclosed herein are various embodiments of systems, devices, components and methods for hermetically sealing electronic modules and packages while controlling the squeeze-out of sealing material.

Figure 1:
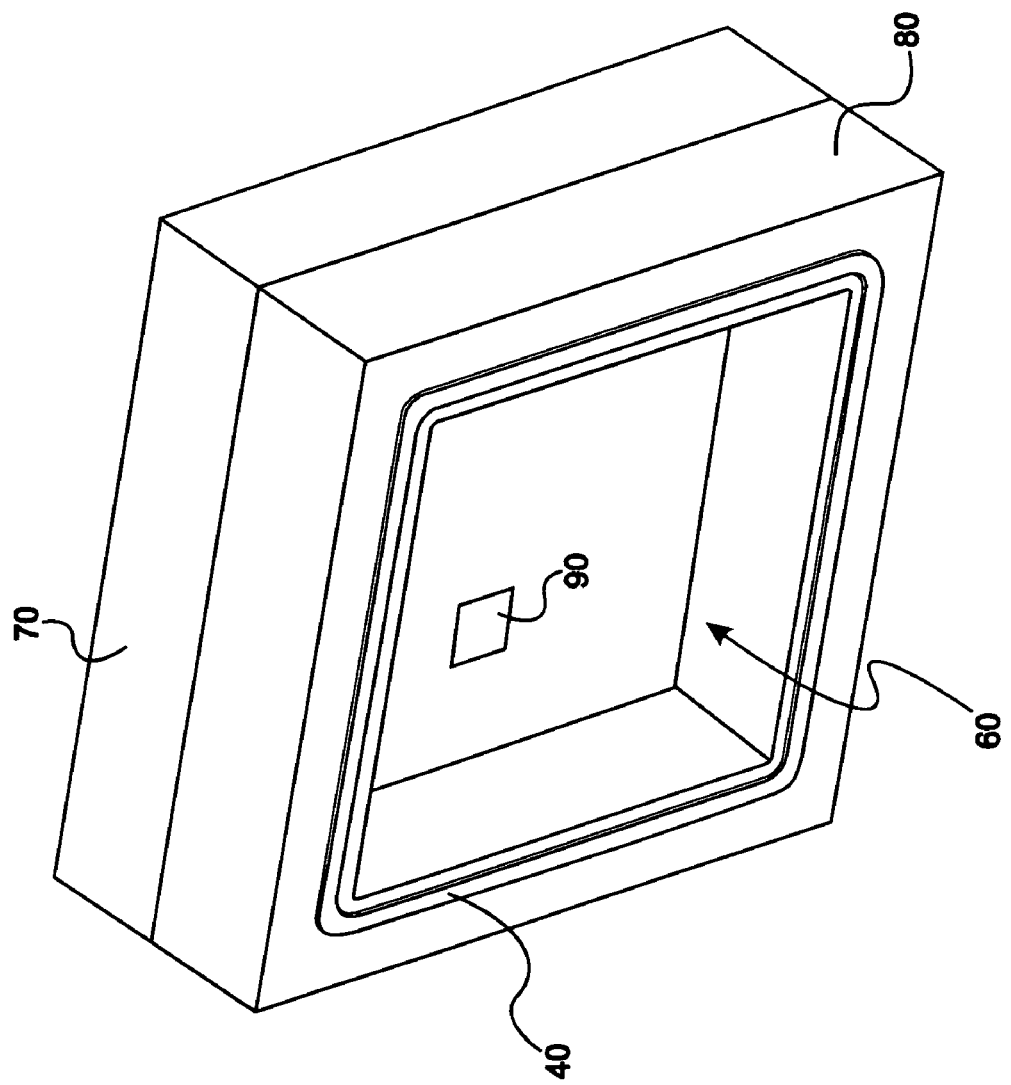
FIG. 1 shows a perspective view of a package lid according to one embodiment of the present invention.

FIG. 1 shows a perspective view of MEMS package lid 10 according to one embodiment of the present invention. MEMS package lid 10 preferably comprises two layers 70 and 80, where first layer 70 is formed of silicon and second layer 80 is formed of glass. First layer 70 is preferably formed using conventional silicon semiconductor formation techniques. By way of example, lens 90 disposed in first layer 70 may be a diffractive lens formed by multiple etching steps as disclosed in U.S. Pat. No. 6,947,224 to Wang for "Methods to make diffractive optical elements". Alternatively, lens 90 may be a refractive lens formed using grey scale masking techniques as disclosed in U.S. Pat. No. 6,613,498 to Brown et al. for Modulated exposure mask and method of using a modulated exposure mask," Sep. 2, 2003. Lens 90 may also be formed using other techniques.

Glass layer 80 is preferably formed using ultrasonic machining and Mallory Bonding (or anodic bonding) techniques, such as those employed by BULLEN ULTRASONICS™ of Eaton, Ohio. Metallized pattern 40 comprising a series of rectangles is sputtered or otherwise formed on top of a glass layer of appropriate thickness. The glass wafer is attached by wax to another glass wafer to protect metallized pattern 40 during a subsequent machining process. A slurry is placed atop the glass sandwich and ultrasonic energy is applied thereto. The energized slurry operates on the exposed glass surfaces and forms a plurality of cavities disposed there-through. The resulting glass wafer is then cleaned and anodically bonded to a silicon wafer. Typically, anodic bonding occurs at a temperature of about 300 degrees Celsius and at a voltage of about 400 volts. A solder paste is dispensed on metallized pattern 40, and the solder paste is reflowed in an oven. Flux is then cleaned from the bonded silicon and glass wafer. The bonded glass and silicon wafer is diced or singulated into individual dies using a diamond cutting wheel mounted on a singulating saw operating at about 30,000 rpm. Such saws are manufactured by DISCO™ of Japan and KULICKE AND SOFFA™ of Fort Washington, Pa. The dicing operation produces lids similar to that illustrated in FIG. 2.

An alternative method of forming lid 10 begins with a thick silicon wafer having an intermediate oxide layer, commonly referred to as a silicon-on-insulator wafer (or "SOI" wafer). Such a wafer can be formed by bonding two oxidized silicon wafers together. Such wafers are commercially available from companies such as VIRGINIA SEMICONDUCTOR™ and ULTRASIL™. A refractive lens may be formed on the top surface of the wafer. Metallized pattern or seal ring 40 is deposited on the back side of the wafer, which is then etched using Deep Reactive Ion Etching (DRIE) techniques developed by Robert Bosch GmbH™.

DRIE techniques are capable of etching silicon cavities having substantially vertical sidewalls. Cavity 60 may be formed using the DRIE process until the intermediate oxide layer is exposed, at which point the etching process is terminated. The exposed oxide can be etched using a buffered hydrogen fluoride solution. Solder paste can be dispensed using conventional screen printing techniques. After reflowing the solder paste in an oven, the resulting flux is cleaned up and the lids are singulated as described above.

The DRIE process provides several advantages, such as no ultrasonic machining steps being required, the ability to use high-precision lithography techniques to define the cavity, the formation of cavities 60 of highly precise dimensions. Since in such an embodiment of the present invention only silicon is used to lid 10, and no glass is present in lid 10, the dicing process for singulating lids 10 has substantially lower production costs compared to dicing lids having combined glass and silicon wafers.

Referring now to FIG. 1, there is shown metallized pattern or metal sealing ring 40 of lid 10, which is configured to engage corresponding metallized pattern or sealing ring 50 of submount 20 (see FIG. 3), with an hermetic solder seal disposed therebetween. Rings 40 and 50 are laid down on a glass, ceramic or silicon substrate by means of evaporative methods, sputtering, lithographic or other techniques well known in the art. Metal rings 40 and 50 are preferably formed of one or suitable metals or metal alloys, such metals or metal alloys typically being selected on the basis of the particular solder that will be employed to form the hermetic seal between the lid and the submount. The selection of an appropriate metal or metal alloy for rings 40 and 50 may be an involved process, as those skilled in the art of under bump metallurgy (or UBM) well know.

If a tin-based solder such as a tin-silver-copper eutectic formulation is used to join rings 40 and 50, rings 40 and 50 are most preferably formed of three separate layers. The adhesion layer is laid down on the substrate, and preferably comprises titanium, titanium and tungsten, or chromium. The middle barrier layer preferably comprises platinum, nickel or a nickel-vanadium alloy. The sealing layer is preferably configured to facilitate the flow of solder around rings 40 and 50 and also to prevent oxidation of the barrier layer. Consequently, the sealing layers of rings 40 and 50 preferably contain gold, a gold alloy or another suitable non-oxidizing metal or metal alloy such as platinum; gold is preferred, however. The gold content of the sealing layers in rings 40 and 50, however, must also not be so high as to cause excessive brittleness of the solder. When lid 10 is soldered to submount 20, the gold present in the sealing layers will dissolve into the solder disposed between rings 40 and 50. To prevent embrittlement, the gold content of the solder seal so formed most preferably should not exceed 4% by weight or volume of the solder joint. It has also been discovered that the corners of rings 40 and 50 should be rounded to avoid bulging up of the solder at the corners, more about which we say below.

The adhesion layer is preferably about 500 angstroms thick, but may range between about 200 Angstroms and about 1000 Angstroms in thickness. The barrier layer is preferably about 1500 angstroms thick, but may range between about 1000 Angstroms and about 3000 Angstroms in thickness. The sealing layer is preferably about 500 angstroms thick, but may range between about 200 Angstroms and about 1000 Angstroms in thickness. As those skilled in the art will now understand, other suitable layered or non-layered metallic structures, thicknesses, and metals or metal alloys may also be employed in the present invention to form rings 40 and 50, depending on the particular application at hand, and the substrates, metals or metal alloys, and solders to be employed.

Figure 2:
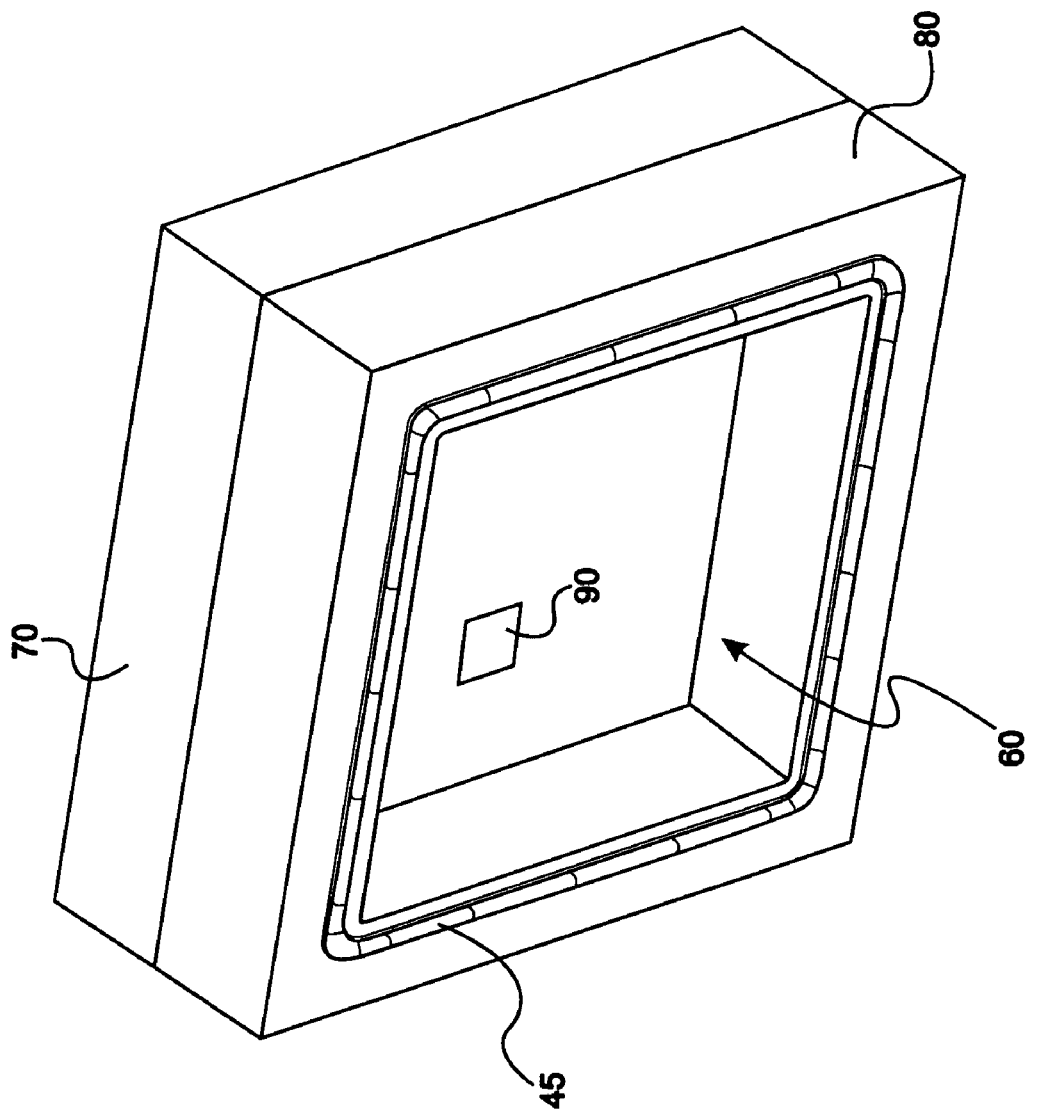
FIG. 2 shows a perspective view of a package lid according to one embodiment of the present invention where solder is disposed on a metallized ring thereof.

As further shown in FIGS. 1 and 2, lid 10 may include optical lens 90, which permits light emitted by laser 120 (shown in FIGS. 2 and 3) to be projected through lid 10. Glass layer 80 illustrated in FIG. 1 must be of greater height or thickness than the tallest component or element mounted on submount 20. Different wavelength and type lasers 100 may be employed in package 30. Note that in contrast to FIG. 1, where sealing ring 40 is illustrated without any solder being disposed thereon, FIG. 2 shows lid 10 having solder 45 disposed over metal ring 40 after a suitable solder paste has been laid down on ring 40 and reflowed.

Figure 3:
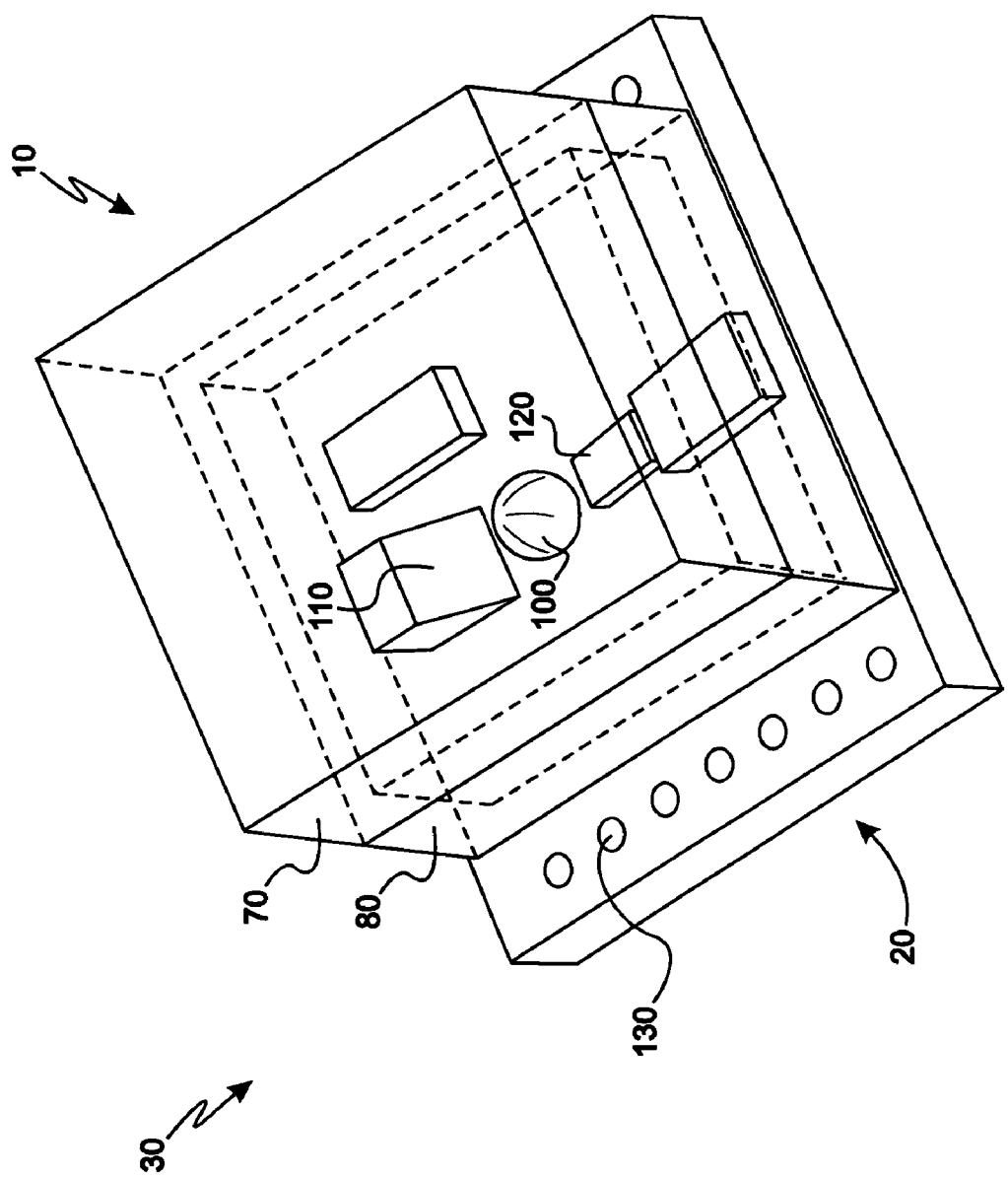
FIG. 3 shows a perspective view of a package submount according to one embodiment of the present invention.
Figure 4:
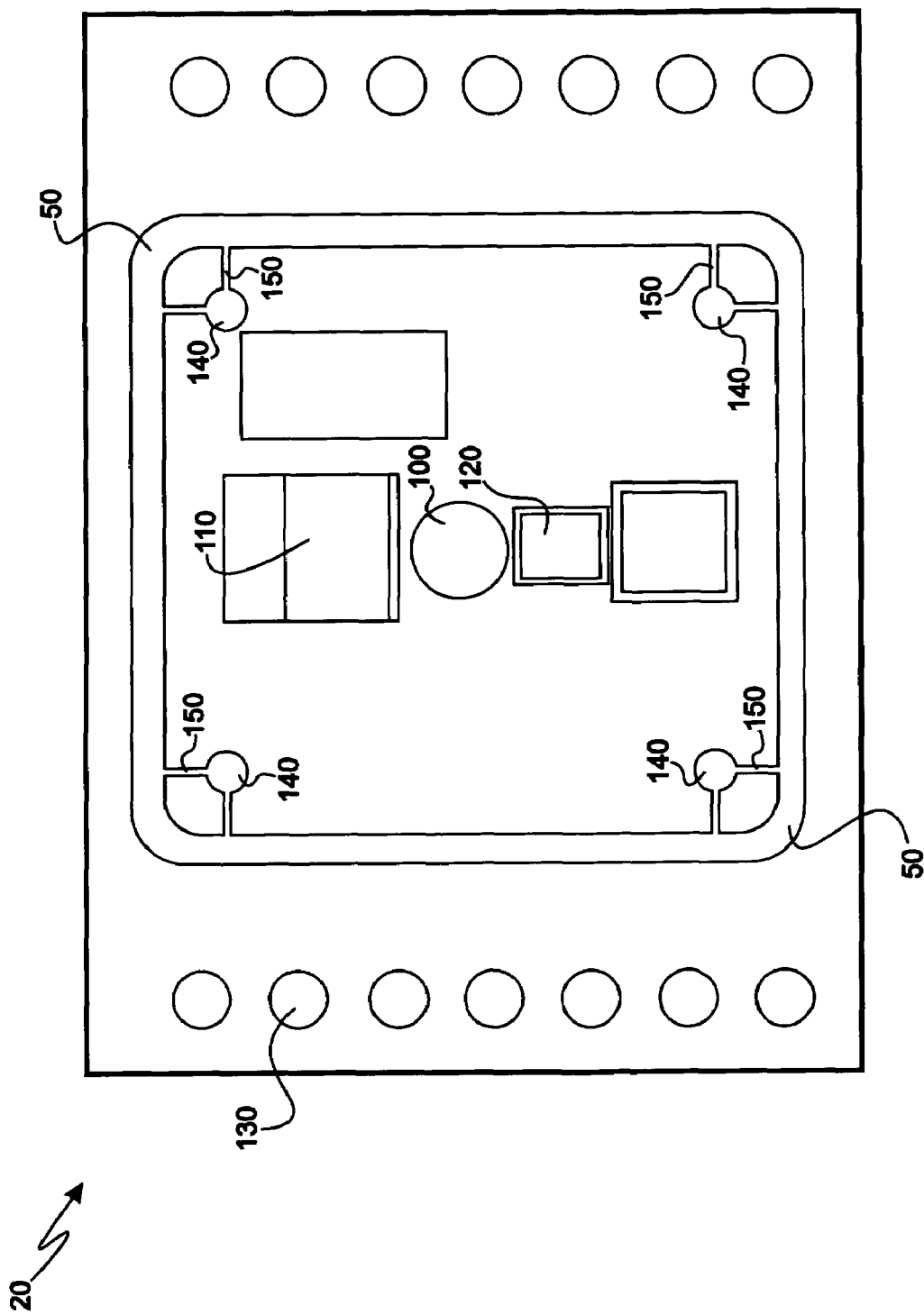
FIG. 4 shows a top view of a package submount according to one embodiment of the present invention.

Referring now to FIGS. 1, 2, 3 and 4, and in an optical transceiver application, lid 10 is preferably about 2.5 mm×2.5 mm wide, and about 2 mm in height. Glass layer 80 is preferably about 0.9 mm in thickness, while silicon layer 70 is about 1.0 mm in thickness. Submount 20 is preferably about 0.5 mm in thickness, planar in shape, and is preferably formed from silicon using well known semiconductor wafer and circuit fabrication techniques. The thickness of submount 20 may also range between about 0.25 mm and about 1.0 mm, or may be any other suitable thickness for a given application. Materials other than silicon may be employed to form submount 100, such as glass and or ceramic (e.g., aluminum nitride). As shown in FIGS. 3 and 4, the top surface of submount 20, in addition to having metallized ring 50 formed thereon, is typically (although not necessarily) populated with sapphire ball 100, laser 120, reflecting mirror 110, contacts 130, and various other electronic components, integrated circuits and wiring.

Figure 5:
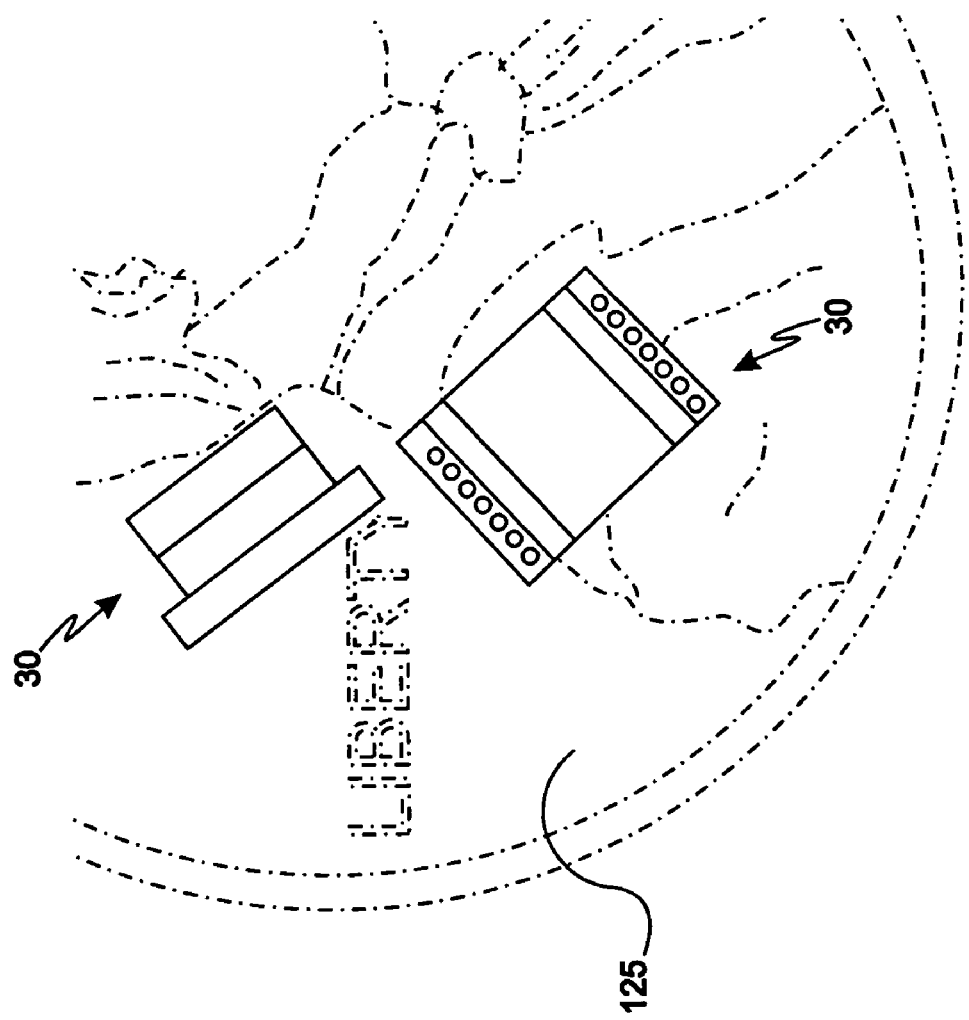
FIG. 5 shows scaled views of two packages according to one embodiment of the present invention.
Figure 6A:
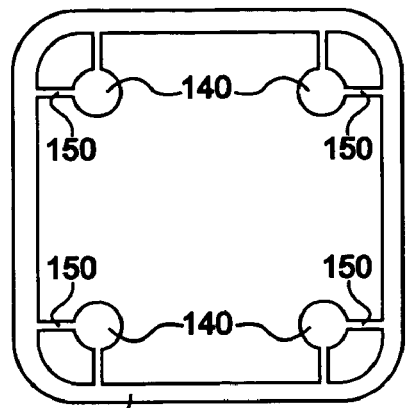
FIGS. 6a through 6c show different embodiments of thieving patterns of the present invention.
Figure 6B:
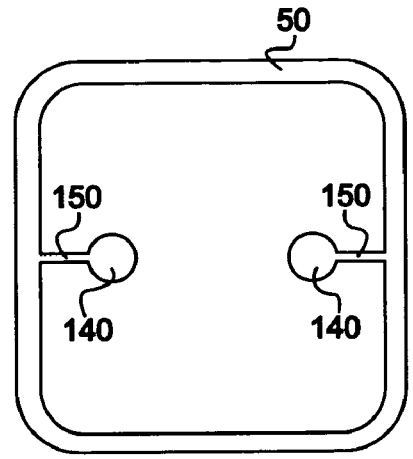
Figure 6C:
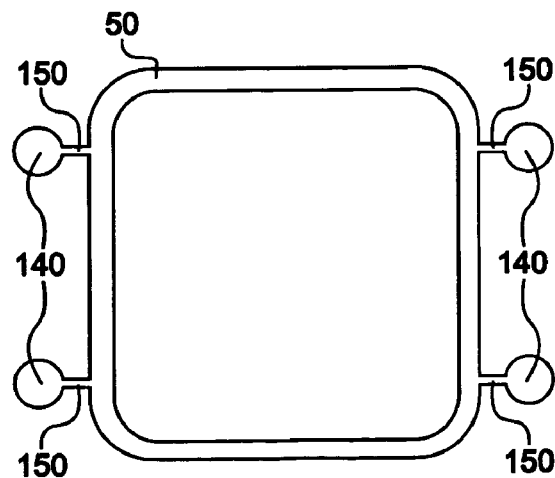

FIG. 5 illustrates the small size of one embodiment of package 30 of the present invention in comparison to a U.S. penny. At the upper left-hand corner of FIG. 5 there is shown a package 30 disposed on its side. The central lower portion of FIG. 5 shows a top view of a package 30.

Hermetic sealing of package 30 implies the use of a malleable, molten or flowable material, such as solder or an appropriate adhesive, to form the seal between rings 40 and 50. As mentioned above, and in one embodiment of the present invention, solder is the preferred material for forming such an hermetic seal. Because the use of most lead-based solders has diminished owing to safety, health and environmental reasons, tin-based solders are most preferably employed in the various embodiments of the present invention (although lead-based solders may be used if proper precautions are taken).

Although other solder reflow techniques may be employed in some embodiments of the present invention, a preferred method of soldering lid 10 to submount 20 involves the use of vacuum solder reflow techniques using equipment manufactured, for example, by ATV TECHNOLOGIE™ GmbH of Vaterstetten, Germany. Soldering the hermetic joint between lid 10 and submount 20 under vacuum or near-vacuum conditions helps to prevent unwanted oxidation of the tin-based solder seal, which is typically highly reactive in an oxygen atmosphere. Vacuum solder reflow techniques also have the advantage of using no flux during soldering. As a result, damage to components mounted on submount 20 such as laser 120, sapphire ball 100 and mirror 110 from wayward flux is prevented when such techniques are employed. A potential alternative to using the soldering methods provided by ATV TECHNOLOGIE™ equipment is to use MCNC PAD fluxless soldering techniques, provided fluorine gas emitted thereby can be suitably controlled to prevent damage to electronic components inside package 30.

When using a vacuum solder reflow technique to solder and hermetically seal lid 10 to submount 20, lid 10 and submount are first placed inside a vacuum chamber after a tin-based solder has been disposed on rings 40 and 50, and rings 40 and 50 have been properly aligned with one another with lid 10 sitting atop submount 20. The chamber is sealed and evacuated down to an ambient pressure ranging between about 1 and 2 milliTorrs. Argon gas with 4% hydrogen gas is next introduced into the chamber. A microwave source coupled into the chamber creates a plasma. Those skilled in the art will appreciate that argon is easier to excite into a plasma state. In turn, the hydrogen in the chamber is also excited to create a highly reducing atmosphere. Excited hydrogen molecules are capable of reducing the tin oxide on the surface of the solder. The lid and submount assembly are heated on a stage by radiative heating above the melting temperature of the solder, which is typically around 250 degrees Celsius. A typical lead free solder has a melting point of about 220 degrees Celsius. The reduction of the tin-oxide on the surface of solder 45 permits lid 10 to float freely on solder 45. The resulting position of lid 10 thus depends only on the shape of metallized pattern 40 and the surface tension force of solder 45. In such a manner self-alignment of lid 10 with submount 20 is achieved.

Further information concerning vacuum solder reflow techniques is disclosed in the brochure "Perfect Reflow Soldering" published by ATV TECHNOLOGIE™ GmbH, a copy of which publication is submitted on even date herewith in the Information Disclosure Statement accompanying the present application, and which is hereby incorporated by reference herein in its entirety.

In one embodiment of the present invention, tin-based solder 45 between 30 and 35 microns in thickness is applied to ring 40 prior to lid 10 being soldered to submount 20. Before lid 10 is hermetically sealed to submount 20 by soldering, solder is first applied to ring 40, most preferably using screen printing techniques while the solder is in a paste form. It has been discovered that the thickness of the tin-based solder paste laid down on ring 40 is most preferably between about 30 microns and 35 microns in thickness. If the solder paste is laid down too thin, lid 10 will not float on and cannot align properly with submount 20 during the solder reflow process. If the solder paste laid down on ring 40 is too thick, the solder will tend to bulge up into a large ball at one of the corners of the ring on the lid. This causes the solder to be uneven on the ring. When a proper thickness of solder is placed on ring 40, ring 40 of lid 10 and ring 50 of submount 20 will self-align during the solder reflow process owing to the action of the surface tension of the molten solder. Such alignment is critical in the case where package 30 contains a laser that must project a beam through lens 90 according to very tight dimensional tolerances.

During the course of attempting to form hermetic seals between lids 10 and submounts 20 of the present invention using the above-described vacuum solder reflow technique, it was discovered that when the vacuum was removed from inside the chamber to permit cooling of package 30, solder from the hermetic joint was forced inside package 30 owing to the different pressures acting on the exterior of package 30 and the interior of package 30; recess 60 of package 30 remained under vacuum after the vacuum outside package 30 had been lifted. Moreover, it was discovered that for practical purposes cooling of package 30 must proceed under a non-vacuum atmosphere to permit heat from package 30 to flow away therefrom, which cannot occur under a "vacuum" atmosphere, or at least cannot occur at a fast enough rate.

Interestingly, even when solder reflow occurs under non-vacuum conditions, lid 10 may still be forced down upon submount 20. This is because the solder reflow temperature is typically about 30 degrees centigrade above the melting point of the solder; complete sealing around metallized pattern 40 or sealing ring 40 normally happens at a temperature higher than solder 45's melting point. Upon cooling down, the gas present in cavity 60 contracts, and thus the pressure inside cavity 60 is still lower than that outside cavity 60. As a result, lid 10 is pushed down on submount 20 until solder 45 solidifies.

Experience showed that while in many cases a solder joint between lid 10 and submount 20 might remain hermetically sealed after a vacuum was lifted, X-ray imaging showed that solder balls would occasionally form inside or outside package 30 during cooling. Further experimentation showed that it was very difficult, if not impossible, to control where such solder balls would appear inside package 30, and that surface tension phenomena dominated the behavior and ultimate location of the cooled solder balls. Those skilled in the art will appreciate that errant solder balls disposed inside a high-precision hermetically sealed electronics module are undesirable, and to be avoided whenever possible.

Accordingly, and in one embodiment of the present invention, the solution to the problem of solder balls forming inside package 30 during the vacuum solder reflow process is provided by forming thieving pads 140 and thieving connections 150 on submount 20. Pads 140 and connections 150 are physically connected to the seal ring or metallized pattern 40. Properly configured and placed on submount 20, thieving pads 140 and thieving connections 150 operate to pull excess molten solder from ring 40 towards pads 140 before and while the hermetic solder seal is cooling. Such excess solder pulled onto thieving pads 140 would otherwise form squeezed-out solder, which in turn might form the aforementioned solder balls located inside cavity 60.

Thieving pads 140 and thieving connections 150 operate to capture and hold solder on thieving pads 140 before and during the cooling process. Once cooling of package 30 has been completed, solder attracted to thieving pads 140 solidifies and remains attached to such pads 140, instead of detaching inside package 30 and possibly damaging or shorting out one or more of the various components disposed therewithin.

In one embodiment of the present invention, the vacuum pulled during the solder reflow process is gradually released, and package 30 is permitted to cool gradually while the hermetic solder seal between lid 10 and submount 20 solidifies. The corners of sealing rings 40 and 50 should be rounded to facilitate the flow of solder around rings 40 and 50 towards thieving pads 140, and to prevent the formation solder balls at sharp corners.

FIGS. 4 and 6A through 6C illustrate various embodiments of thieving pads 140 and thieving connections 150 of the present invention. As shown in such Figures, thieving connections 150 preferably form a connective strip between metallized ring 40 and thieving pads 140, and provide a means by which molten solder may flow from ring 40 to thieving pads 140. As illustrated, thieving pads 140 are preferably circular in shape, although other shapes such as ellipses, rectangles, triangles, squares, pentagons, sextagons, septagons, octagons, and other shapes may also be employed. Thieving connections 150 are preferably strip-shaped, although other shapes and configurations may be employed. Thieving pads 140 and thieving connections 150 may comprise one or more of gold, tin, titanium, copper, indium, platinum, nickel, tungsten, chromium, vanadium, or combinations, mixtures or alloys of any of the foregoing.

The size or surface area of a solder pad 140 employed in package 30 of a particular design should ideally be designed carefully, taking into account such factors as the requirement for lid 10 to float on the solder joint during reflow soldering, lid 10 having to align properly with submount 20 during reflow soldering, the surface tension of the solder employed when molten, the width and overall length of ring 40, the total volume of solder employed, the thickness of the solder, the weight of lid 10, and other factors.

Each solder pad 140 also should have sufficient size or surface area to contain a volume of solder thereon that will remain less than a hemispherical in shape as solder progressively flows thereon from ring 40. If a given pad 140 is too small in area, the solder collecting thereon will eventually assume a hemispherical shape, at which point the surface tension thereof will cause solder spheres on other pads 140 to decrease in volume. The final result is that the first sphere will attain a hemispherical shape and collects excess solder, including solder from other pads, while other solder spheres on other pads 140 will be decreased in volume. A large solder instead of multiple small solder balls can lead to the large solder ball touching components inside cavity 60, and even cause short circuiting.

It must also be taken into account that each pad detracts from valuable area on submount 20 that would otherwise be available for electronic circuitry or components. Pads 140 and thieving connections 150 therefore should not be made too large. Multiple pads on submount 20 are desirable so that solder may be evenly distributed atop ring 40, and so that molten solder need not flow large distances to reach a pad 140. In addition, large pads 140 are better at absorbing solder than small pads 140, as the surface area of a pad is proportional to the square of the diameter while the solder volume the it can accommodate is proportional to the cube of the diameter of the pad. Thus, for example, four large pads 140 would be better to employ than eight small pads 140 of equivalent combined surface area.

Finally, it has also been determined through experimentation that pads 140 and thieving connections 150 are best positioned symmetrically inside or outside the perimeter defined by metallized patterns or sealing rings 40 or 50. The symmetric mirror-image placement of pads 140 and thieving connections 150 has been found to facilitate the balanced flow of solder between thieving pads 140.

Figure 7:
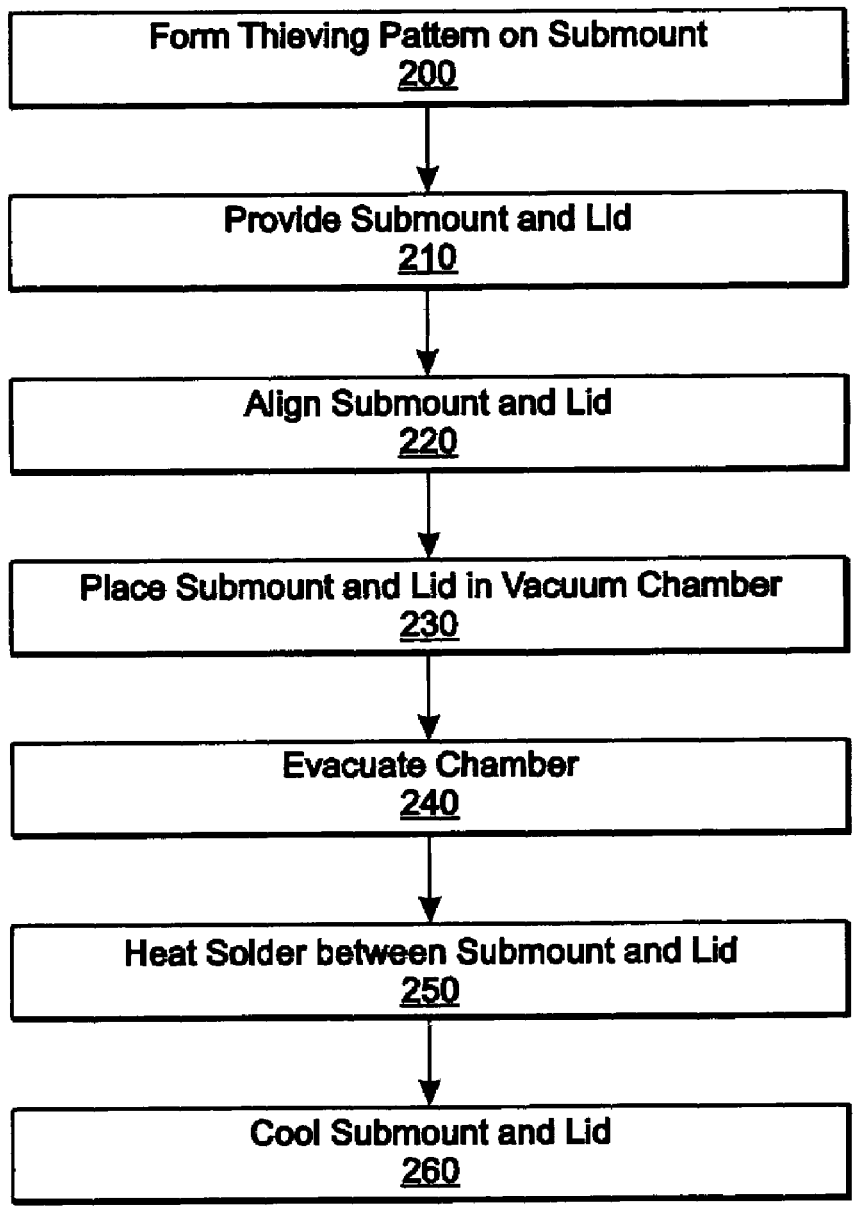
FIG. 7 illustrates a method according to one embodiment of the present invention.

FIG. 7 illustrates method 190 according to one embodiment of the present invention. In step 200, one or more thieving patterns and thieving connections are formed on submount 20. In step 210, lid 10 and submount 20 having corresponding metallized rings 40 and 50 formed thereon, and having an appropriate type and amount solder disposed on at least one of such rings, are provided. In step 220, lid 10 and submount 20 are properly aligned with one another, and lid 10 is placed atop the solder paste disposed between ring 40 of lid 10 and ring 50 of submount 20. Lid 10 and submount 20 are next placed in a vacuum chamber in step 230. The chamber is evacuated in step 240, and hydrogen or another suitable reducing gas or atmosphere is introduced therein. In step 250, the solder disposed between lid 10 and submount 20 is next heated until the solder becomes molten and an hermetic seal is formed between lid 10 and submount 20. Finally, in step 260 package 30 comprising lid 10 hermetically sealed to submount 20 is cooled, most preferably through the gradual release of the vacuum in the chamber. Note that the order of at least some of the steps illustrated in FIG. 7 may carried out differently than as shown in FIG. 7 or as described above.

Finally, in another embodiment of the present invention, one or more standoffs may be employed to maintain a constant gap or spacing between lid 10 and submount 20 during the solder reflow process. According to such an embodiment, the one or more standoffs preferably form slightly flattened gold balls that are positioned on metallized ring 40 after the solder paste has been placed thereon, but before lid 10 has been placed atop submount 20 in anticipation of soldering. In one such embodiment, flattened gold balls are placed at each corner of metallized ring 40 before lid 10 is placed atop submount 20.

The preceding specific embodiments are illustrative of the practice of the invention. It is to be understood, therefore, that other expedients known to those skilled in the art or disclosed herein may be employed without departing from the invention or the scope of the appended claims. For example, the present invention is not limited to use solely in connection with optical transceiver modules, but may also be employed in optical receiver modules, optical transmitter modules, digital micro-mirror MEMS devices such as those employed in Digital Light Processing (DLP™) applications, or indeed any electronics package or module where a hermetic seal between a lid and a submount is necessary or desirable, or where a high degree of precision is required in aligning a lid with a submount. Solder types other than those explicitly disclosed herein may also be employed successfully in the present invention, as may metals and metal alloys for rings 40 and 50 that are not disclosed explicitly herein. Reducing gases other than hydrogen may be employed in the vacuum solder reflow process. Vacuum-less techniques such as bubbling nitrogen through formic acid may also be employed; provided, however that considerable caution is exercised to prevent formic acid vapor from damaging components inside package 30. Temperature ranges and time periods other than those disclosed explicitly herein may also be employed.

Having read and understood the present disclosure, those skilled in the art will now understand that many combinations, adaptations, variations and permutations of known semiconductor materials, silicon materials, ceramics, glasses, solders, metals, metal alloys, solders, and electronics components, and their associated methods, may be employed successfully in the present invention.

In the claims, means plus function clauses are intended to cover the structures described herein as performing the recited function and their equivalents. Means plus function clauses in the claims are not intended to be limited to structural equivalents only, but are also intended to include structures which function equivalently in the environment of the claimed combination.

All printed publications and patents referenced hereinabove are hereby incorporated by referenced herein, each in its respective entirety.

We claim:

1. An electronics module, comprising:
   (a) a submount having an upper surface upon which a first metallized pattern is disposed, and
   (b) a lid comprising a bottom edge, sidewalls and a top, the sidewalls and top forming a cavity for covering the electronics components, the bottom edge having a second metallized patten;
   (c) at least one thieving pad disposed on the submount;
   (d) at least one thieving connection on the submount and connecting the at least one thieving pad to the first metallized pattern;
   wherein the first and second metallized patterns are configured to form an hermetic seal when molten solder is disposed therebetween and excess molten solder from the hermetic seal is drawn to the at least one thieving pad across the at least one thieving connection while the hermetic seal is forming.

2. The electronics module of claim 1, further comprising electronics components.

3. The electronics module of claim 1, wherein the first and second metallized patterns form rings.

4. The electronics module of claim 1, wherein the at least one thieving pad comprises at least one of gold, tin, titanium, copper, indium, platinum, nickel, tungsten, chromium, vanadium, and combinations, mixtures or alloys of any of the foregoing.

5. The electronics module of claim 1, wherein the at least one pad is circular or substantially circular in shape.

6. The electronics module of claim 1, wherein a plurality of thieving pads are operatively connected to the first metallized pattern.

7. The electronics module of claim 1, wherein the submount comprises at least one of silicon, a semiconductor material, a MEMS material, aluminum nitride, ceramic and glass.

8. The electronics module of claim 1, wherein at least one of an active electronic or electrical component and a passive electronic or electrical component is mounted on the submount.

9. The electronics module of claim 1, wherein the thickness of the submount ranges between about 0.1 mm and about 1.0 mm.

10. The electronics module of claim 1, wherein the submount is planar in shape.

11. The electronics module of claim 1, wherein the module is one of an optical transceiver module, an optical receiver module and an optical transmitter module.

12. The electronics module of claim 1, wherein the module comprises at least one laser.

13. The electronics module of claim 1, wherein the lid further comprises an optical window or lens.

14. The electronics module of claim 1, wherein the lid comprises at least one of silicon, a semiconductor material, a MEMS material, aluminum nitride, ceramic, glass and a material formed by a DRIE process.

15. The electronics module of claim 1, wherein the lid is formed by at least one of anodic bonding of glass and silicon layers and reactive etching of a silicon-on-insulator wafer.

16. The electronics module of claim 1, wherein the thickness of the lid ranges between about 0.1 mm and about 2 mm.

17. The electronics module of claim 1, wherein at least one of the first and second metallized patterns comprises at least one of gold, tin, titanium, copper, indium, platinum, nickel, tungsten, chromium, vanadium, and combinations, mixtures or alloys of any of the foregoing.

18. The electronics module of claim 1, wherein the metallized patterns are formed by at least one of vapor deposition techniques, evaporative techniques, and sputtering techniques.

19. The electronics module of claim 1, wherein the solder is applied to at least one of the metallized patterns using screen printing techniques.

20. The electronics module of claim 1, wherein the solder comprises at least one of tin, copper, gold, indium, lead, a lead-free solder, and alloys, combinations and mixtures of any of the foregoing.

21. The electronics module of claim 1, wherein the thickness of the solder ranges between about 3 microns and about 50 microns.

22. The electronics module of claim 1, wherein the solder contains less than 4% gold by weight or volume after the solder has cooled between the first and second metallization patterns.

23. The electronics module of claim 1, wherein the first and second metallized patterns comprise at least two layers each.

24. The electronics module of claim 1, wherein the first and second metallization patterns each comprise first, second and third layers, the first layer comprising titanium, the second layer comprising platinum, and the third layer comprising gold.

25. The electronics module of claim 24, wherein the first layer ranges between about 200 Angstroms and about 1000 Angstroms in thickness, the second layer ranges between about 1000 Angstroms and about 3000 Angstroms in thickness, and the third layer ranges between about 200 Angstroms and about 1000 Angstroms in thickness.

26. The electronics module of claim 1, wherein the first and second metallized patterns feature rounded corners.

* * * * *